United States Patent
Hill et al.

(10) Patent No.: US 7,363,604 B2
(45) Date of Patent: Apr. 22, 2008

(54) ACCURATE NOISE MODELING IN DIGITAL DESIGNS

(75) Inventors: Anthony M. Hill, Dallas, TX (US); John Apostol, Plano, TX (US); Usha Narasimha, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 288 days.

(21) Appl. No.: 11/240,924

(22) Filed: Sep. 30, 2005

(65) Prior Publication Data

US 2007/0079265 A1   Apr. 5, 2007

(51) Int. Cl.
*G06F 17/50*  (2006.01)
*G06F 9/45*   (2006.01)

(52) U.S. Cl. .................. 716/5; 716/3; 716/4; 716/6
(58) Field of Classification Search ............ 716/3, 716/4, 5, 6
See application file for complete search history.

(56) References Cited

U.S. PATENT DOCUMENTS

| | | | | |
|---|---|---|---|---|
| 5,568,395 A | * | 10/1996 | Huang ............................ | 716/4 |
| 5,596,506 A | * | 1/1997 | Petschauer et al. ............ | 716/5 |
| 7,181,716 B1 | * | 2/2007 | Dahrou ....................... | 716/13 |
| 2003/0079191 A1 | * | 4/2003 | Savithri et al. ................ | 716/4 |
| 2005/0039151 A1 | * | 2/2005 | Levy ............................. | 716/6 |
| 2007/0044048 A1 | * | 2/2007 | Kameyama et al. ........... | 716/4 |

* cited by examiner

*Primary Examiner*—Stacy A Whitmore
*Assistant Examiner*—Magid Y. Dimyan
(74) *Attorney, Agent, or Firm*—Mirna G. Abyad; Frederick J. Telecky, Jr.

(57) ABSTRACT

A novel approach to cross-talk analysis takes effective account of the nature of cross-talk interference. This approach employs conservative assumptions regarding (1) the equivalent output resistance, and (2) the definition of noise immunity for the victim gate. Also, this approach uses signal and noise current metrics in modeling the parameters of the active device elements. This approach provides an expectation of detection and elimination of noise hazards that might otherwise not be undetected.

9 Claims, 5 Drawing Sheets

ACCURATE NOISE MODELING IN DIGITAL DESIGNS

TECHNICAL FIELD OF THE INVENTION

The technical field of this invention is digital integrated circuit noise modeling used for design.

BACKGROUND OF THE INVENTION

Design of current digital electronics systems use sophisticated modeling techniques to analyze every aspect of device behavior. While functional performance and parametric specifications such as propagation delay and clock speed receive a large share of attention in a device analysis, increasing effort is being devoted to system environment concerns including noise environment behavior.

In a digital device, signals are routed using metallic interconnect of very small dimensions often separated by only minute distances from possible sources of signal interference. Advancing technologies have caused interconnect dimensions and spacing to undergo reductions. These effects dictate that increasing attention be given to analysis of noise and cross-talk performance. The challenge of such analysis has been heightened as it has been noted that noise and cross-talk are often highly non-linear in character.

Typically, conventional forms of analysis avoid the use of complex metrics and employ simplified models leading to analysis that has lacked accuracy. It has become increasingly clear that improved methods of noise analysis are necessary. Although designers have long been aware of the types of noise that must be dealt with, seldom have the analytical tools been available to adequately assess the problem and provide effective solutions. Cross-talk effects are of increasing interest because the problem of cross-talk has been pervasive and the tools to analyze it have been inadequate.

Conventional cross-talk noise analysis is based on consideration of the interaction of multiple victim gates with an aggressor cross-talk noise source illustrated in FIG. 1. The output of primary victim gate 101 is connected to the input of a secondary victim gate 102. Cross-talk noise analysis is intended to evaluate the sensitivity of gate 101 to aggressor cross-talk noise-at node 105 coupled to output node 111 via parasitic capacitance 109 and the effect this cross-talk noise at node 105 has in producing a false logic at input node 111 of secondary victim gate 102 that exceeds the noise immunity of gate 102. The primary victim gate 101 is viewed as a structure that generates an output current $I_{out1}(t)$ 107 as a function of an input voltage $V_{in\_1}(t)$ 110. Gate 100 couples into the primary victim gate 101 at node 110 and output signal 112 is used to display and analyze possible false logic level disturbances that result from the cross-talk noise. The analysis typically keys on the effects that a non-ideal input condition at node 110 have exacerbating the aggressor cross-talk noise coupled into node 111. This non-ideal input condition can be a result of additional actual noise coupled to node 110 or insufficient drive strength of gate 100 driving node 110.

FIG. 2 illustrates the circuit of a typical CMOS inverter gate 200 composed of a PMOS transistor 201 and an NMOS transistor 202 connected in tandem between supply voltage $V_{DD}$ 203 and ground voltage $V_{SS}$ (GND) 204. Assuming static (DC) conditions, gate 200 input voltage is $V_{IN}$ 205 and gate 200 output voltage is $V_{OUT}$ 210. The drain current in full 'on' condition for the PMOS transistor 201 is denoted by $I_P$ 206 and the drain current in full 'on' condition for the NMOS transistor 202 is denoted by $I_N$ 207. $I_{OUT}$ 208 equals the difference between the current drives of the PMOS and the NMOS transistor. This difference is designed to be in balance $I_P = I_N$ at an input voltage $V_{IN} = V_{THRESHOLD}$, the gate input threshold.

FIG. 3 illustrates the DC transfer function of the CMOS inverter of FIG. 2. The transfer function has three separate regions: (input low, output high) 301, (transition region) 302, and (input high, output low) 303. In ordinary analysis the separation between the transition region 302 and the non-transition regions 301, and 303 is marked by a slope=−1 (305, 306) in the transfer function curve. Operation in regions 301 and 303 is characterized by stable gate performance protected by noise immunity as noted by 307 and 308. Concise unequivocal definitions of noise immunity have always been the aim in developing noise-analysis techniques. We will assume that the lesser value of noise immunity NI 307 or NI 308 is to be used in noise immunity assumptions. We assign the label NI* to this lesser value.

FIG. 4 illustrates the conventional model of victim gates subjected to cross-talk noise. For convenience in the massive amount of calculations required for the analysis, the CMOS gate of FIG. 2 is replaced by a simplified model (shown as gate 401 of FIG. 4). Aggressor noise 405 is viewed as coupling to victim node 411 via parasitic capacitance 406 to the equivalent ideal DC static output resistance R* 403 of the victim gate. The R* value for an individual victim gate in a very large netlist of gates is easily determined by parametric extraction and the particular value of R* will depend, for example, on the transistor sizes of the victim gate of interest. The effect not properly accounted for in this conventional model is that the primary victim gate may have a non-ideal input condition arising from incomplete recovery to its static value. The value of R 403 is then in reality non-ideal, higher that the R* value, and more susceptible to coupling of noise across capacitor 406. The non-ideal condition at the primary victim gate 400 could also result from the simultaneous presence of noise at both the input 410 and the output 411 of the primary victim gate 400.

Conventional cross-talk analysis also uses the value of NI* developed graphically in FIG. 3 for the noise immunity as the criteria for generation of false logic levels at the secondary victim gate 402. Conventional computer aided circuit analysis on cross-talk noise effects, therefore, proceeds on these two simplifying assumptions:

1. The primary victim gate may be represented by a simple resistor model using R* as the equivalent output resistance value.
2. The noise immunity of the secondary victim gate is the DC noise immunity NI* of the CMOS gate of FIG. 3.

These two assumptions unfortunately do not take into account the effect that these quantified parameters R* and NI* are decoupled from one another and this leads to overly optimistic conclusions regarding susceptibility to cross-talk noise.

SUMMARY OF THE INVENTION

This invention provides a novel approach to cross-talk analysis that takes effective account of the nature of cross-talk interference. The approach employs conservative assumptions regarding (1) the equivalent output resistance, and (2) the definition of noise immunity for the victim gate. Also, unlike earlier conventional approaches, which employed only noise voltage metrics to the modeling and analysis, the approach described here uses signal and noise current metrics to derive the model parameters used to describe active device elements. Because I-Drive shows greater sensitivity to noise interference, the result is higher accuracy in the modeling and the ability to recognize potential hazards to design performance due to cross-talk interference in particular. This form of more accurate noise performance modeling provides expectation of detection and elimination of noise hazards that might otherwise be undetected.

BRIEF DESCRIPTION OF THE DRAWINGS

These and other aspects of this invention are illustrated in the drawings, in which:

FIG. 5 contrasts the parametric assumptions used in the present invention to the assumptions of conventional analysis;

DETAILED DESCRIPTION OF PREFERRED EMBODIMENTS

The task of cross-talk noise analysis is: (a) to quantify the sensitivity that a given victim node has to aggressor noise and (b) relate that sensitivity to noise immunity of the gate whose input receives that noise. Thus all potential victim nodes in a component level netlist must be graded in this manner as to their susceptibility logic errors caused by cross-talk noise.

Figure 1:
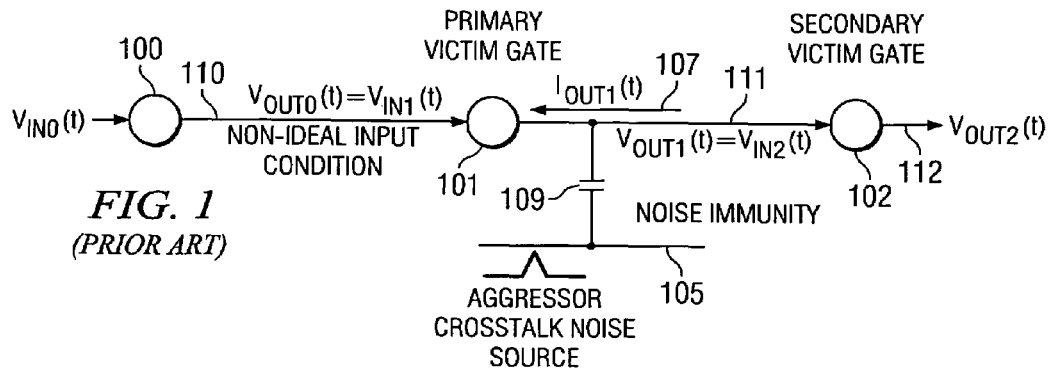
FIG. 1 illustrates a set of three cascaded victim gates subjected to an aggressor cross talk noise source (Prior Art)
Figure 2:
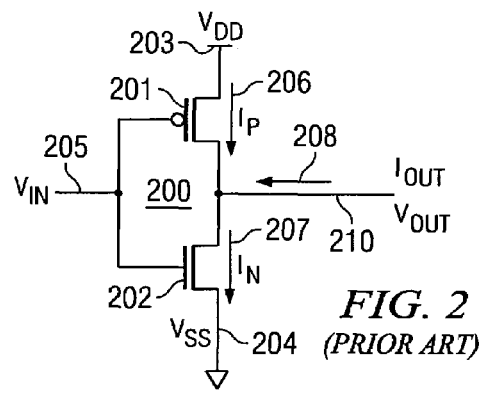
FIG. 2 illustrates the circuit elements and electrical parameters of a typical CMOS inverter gate (Prior Art)
Figure 3:
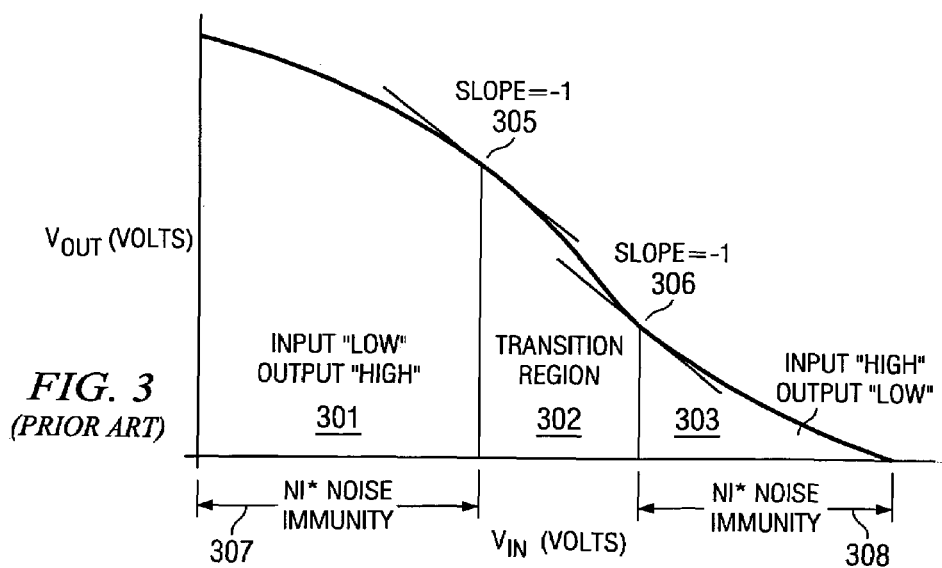
FIG. 3 illustrates the transfer function of the CMOS inverter of FIG. 2 (Prior Art)
Figure 4:
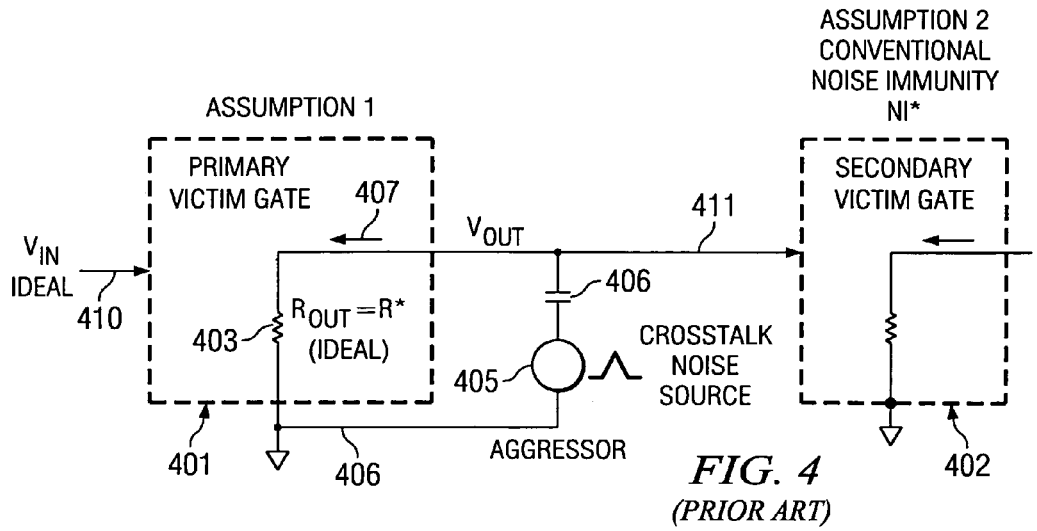
FIG. 4 illustrates the model for cascaded victim gates and the simplifying assumptions regarding output resistance, $R_{OUT}=R^*$, and noise immunity, $NI=NI^*$, used in conventional cross-talk noise analysis (Prior Art)
Figure 5:
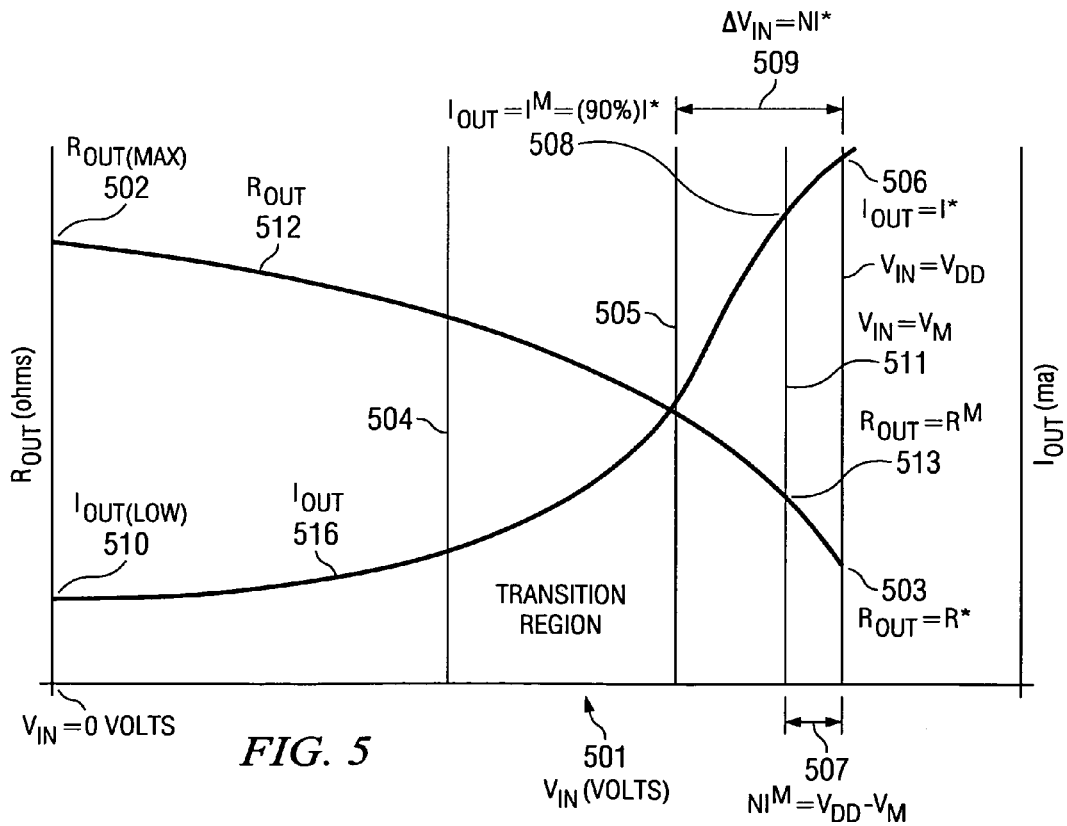
FIG. 5 illustrates the plot of $R_{OUT}$ versus $V_{IN}$ and $I_{OUT}$ versus $V_{IN}$ for a CMOS inverter as $V_{IN}$ increases from $V_{IN}=0$ volts gate-to-source ($V_{GS}$) to full supply voltage, $V_{IN}=V_{GS}=V_{DD}$.

FIG. 5 illustrates the characteristics of a victim gate, the CMOS inverter of FIG. 2. As the input voltage $V_{IN}$ 501 changes from zero volts to $V_{DD}$, the output resistance $R_{OUT}$ 512 changes from $R_{OUT(MAX)}$ 502 at $V_{IN}=V_{GS}=0$ volts, to $R^*$ 503 at $V_{IN}=V_{GS}=V_{DD}$. In the transition region with boundaries marked by 504 and 505 the output current $I_{OUT}$ increases as the PMOS current is reduced and the NMOS current increases. In the low $V_{IN}$ region below 504, $I_{OUT} \approx I_P$ and in the high $V_{IN}$ region above 505, $I_{OUT} \approx I_N$.

As the input voltage $V_{IN}$ 501 changes from zero volts to $V_{DD}$, the output drive current $I_{OUT}$ changes from $I_{OUT}=I_{OUT(LOW)}$ 510 at $V_{IN}=V_{GS}=0$ volts, to $I_{OUT}=I^*$ 506 at $V_{IN}=V_{GS}=V_{DD}$. The constraint placed on $I_{OUT}$ in FIG. 5 indicates that the operating condition used for cross-talk analysis in the present invention are marked with the super script 'M' and the constraint on $I_{OUT}$ is chosen to be:

$$I_{OUT}=I^M=(90\%)I^* \qquad (1)$$

This corresponds to an equivalent constraint 513 placed on $R_{OUT}$ in FIG. 5 indicating that the operating condition used for cross-talk analysis in the present invention is chosen to be:

$$R_{OUT}=R^M=\text{>value of } R_{OUT} \text{ with } I^M=(90\%)I^* \qquad (2)$$

Summarizing:

The key points of the noise analysis approach of this invention are the two major re-definitions of pertinent parameters:

First, note that the value of $R_{OUT}$ is increased from the optimistic value $R^*$ 503 based on ideal input voltage conditions to a more realistic (and more accurate) value $R^M$ 510 based on non-ideal input voltage conditions deemed plausible based on the imperfect recovery of the input voltage to its ideal value in dynamic operating conditions. The possibility of input noise occurring simultaneously with cross-talk noise at the victim gate output adds further credence to this assumption. The value $R_{OUT}=R^M$ 510 is based on the corresponding criteria that $I_{OUT}=I^M=(90\%)I^*$ presents a more realistic value of the $I_{OUT}$ for the noise evaluation.

Second, the optimistic noise immunity NI* 509 is replaced by the $NI^M=[V_{DD}-V_M]$ 507, where $V_M$ 511 is the value of $V_{IN}$ where $I_{OUT}=I^M=(90\%)I^*$. This value for $NI^M$ is more realistic for operating conditions of the secondary victim gate. Note that these constraint conditions also couple the $R^M$ and $NI^M$ parameters placing them on consistent footing.

In the present invention two important software tools are used to obtain the desired parameters for a victim gate from the physical layout database.

First, parametric extraction makes possible the extraction of not only the transistor component parameters (based on transistor size) but also the parasitic capacitance and resistance of passive physical structures in the layout. The parametric extraction may be said to yield values for R* and for output capacitance elements of the victim gate.

Figure 7A:
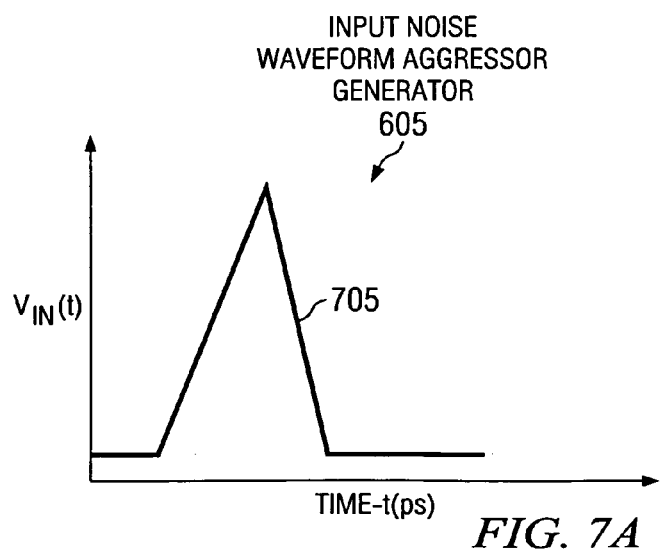
FIG. 7 illustrates the output noise waveform 710 for victim node 611 for cascaded victim gates and the constrained assumptions regarding output resistance, $R_{OUT}=R^M$, and noise immunity, $NI=NI^M$ compared to the output noise waveform 709 at victim node 611 for cascaded victim gates using the simplified assumptions regarding output resistance, $R_{OUT}=R^*$, and noise immunity, $NI=NI^*$.
Figure 7B:
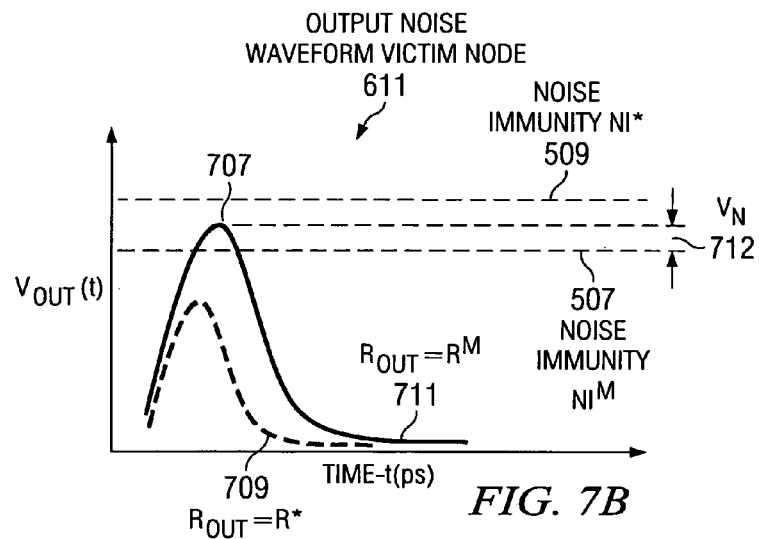

Secondly, static timing analysis (STA) is used to characterize aggressor cross-talk noise source behavior, deducing a more realistic parametric value for $R^A$, aggressor equivalent resistance, and $C^A$, equivalent aggressor capacitance, from slew rate information and RC timing behavior. STA also provides data from which an appropriate noise stimulus may be developed to realistically simulate the noise source. Triangular pulses depicted in 705 of FIG. 7 are used. During noise analysis each potential victim net is examined sequentially. The 'victim' nets are subjected to noise from 'aggressor' nets coupled to the victim nets via a parasitic capacitance.

Advanced spice techniques can be used to estimate how the aggressors and victim interact and one can estimate the noise voltage waveform coupled in to the victim net. The analysis proceeds by examining the resulting injected noise waveform caused at the victim node by the aggressor and the noise immunity characteristics of any victim gate attached.

Figure 6:
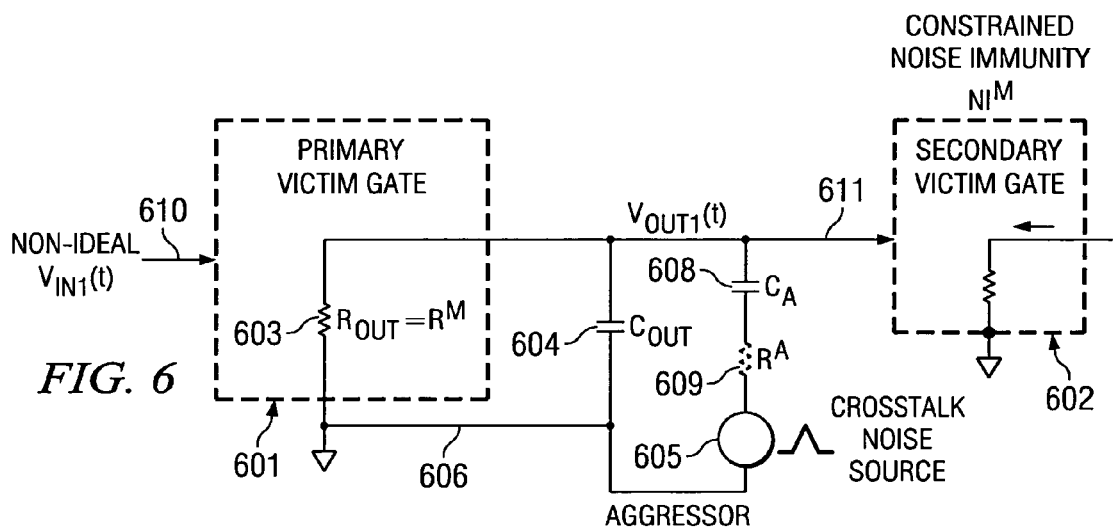
FIG. 6 illustrates the model for cascaded victim gates and the constrained assumptions regarding output resistance, $R_{OUT}=R^M$, and noise immunity, $NI=NI^M$, used in-the cross-talk noise analysis approach described in this invention.

FIG. 6 illustrates the accurate model of victim gates subjected to cross-talk noise as described in this invention.

Once again the CMOS gate of FIG. 2 is replaced by a simplified model (shown as gate 601 of FIG. 6). Aggressor noise 605 is viewed as coupling to victim node 611 via parasitic aggressor capacitance $C^A$, 608 and series aggressor resistance $R^A$ 609 to the model value for DC static output resistance, $R^M$ 603 of the victim gate.

Developing an accurate value for $R^M$ makes use of (a) parametric extraction and (b) static timing analysis. Parametric extraction yields the value of the total gate output capacitance $C_{OUT}$ 604, which includes drain-source capacitance and parasitic capacitance. Static Timing Analysis (STA) yields a slew rate value for the gate of interest. Using the simplified assumption:

$$\text{Slew Rate} = R^M \times C_{OUT} \quad (3)$$

then $$R^M = \text{Slew Rate} \div C_{OUT} \quad (4)$$

The $R^M$ value for an individual victim gate in a very large netlist of gates is thus determined by (a) parametric extraction of parasitic capacitance 604 and (b) computation of $R^M$ from the slew rate value for the victim gate 601. As a check, the value of $R^M$ may be compared to the value R* and validated on the basis that $$R^M >> R^* \quad (5)$$

This basis for comparison leads to assurance of conservative (pessimistic) results in the analysis, but results that identify a greater number of questionable nodes for susceptibility to cross-talk noise.

With the parameter $R^M$ evaluated, the analysis proceeds to the spice analysis of cross-talk noise coupling under the assumption of the input noise waveform 705 at aggressor node 605 illustrated in FIG. 7. This waveform has a leading edge and trailing edge slope equal to the slew rate of gate 601, and an amplitude equal to ½ the voltage threshold of gate 601. Typical output waveforms at node 611 are also illustrated in FIG. 7 plotted as a function of the assumed value for $R_{OUT}$. Output voltage waveform 711 illustrates the cross-talk noise coupled to the victim node assuming the value $R_{OUT}=R^M$. The overly optimistic output voltage waveform 709 based on $R_{OUT}=R^*$ is also illustrated. The noise immunity $NI^A$ as defined by 507 of FIG. 5 is illustrated for comparison to the individual output noise waveforms.

Cross-talk noise analysis includes the generation of the response of each victim gate to aggressor noise as represented by FIG. 7. The goal of the analysis is to identify all victim gates whose peak response 707 exceeds the value of the noise immunity $NI^M$ 507.

Figure 8:
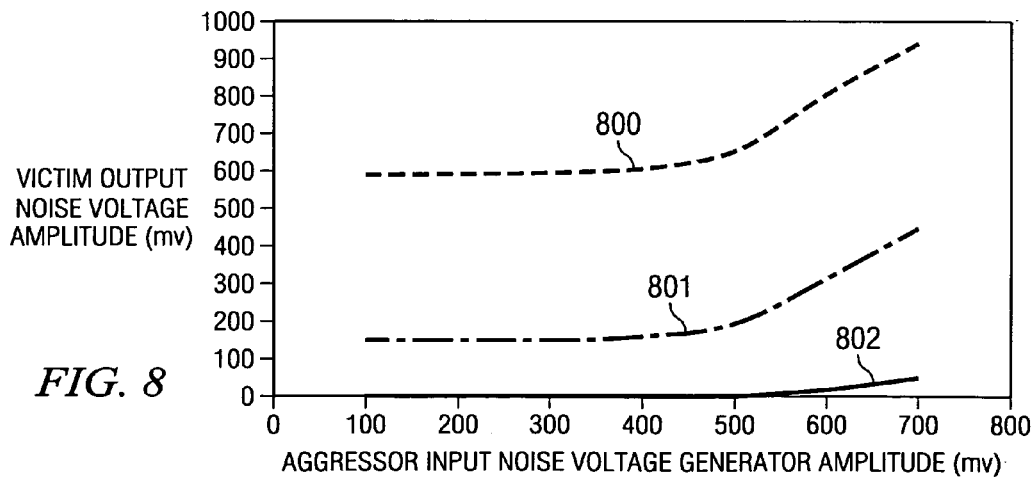
FIG. 8 illustrates variation of the amount of cross-talk noise coupled to the output of a victim gate (Y-axis) as a function of the aggressor input noise (X-axis) with the applied input voltage VIN as a parameter.

Voltage noise metrics are illustrated in FIG. 8. Curve 800 represents the condition $V_{IN}=0.5$ volts; Curve 801 represents the condition $V_{IN}=0.45$ volts; Curve 802 represents the condition $V_{IN}=0.0$ volts. For each incrementally higher instantaneous value of $V_{IN}$, aggressor noise couples in at increasingly high amplitude to become victim output noise. The upward bending of the curves illustrate that the effect is exacerbated at higher levels of aggressor noise and higher instantaneous values of $V_{IN}$.

Figure 9:
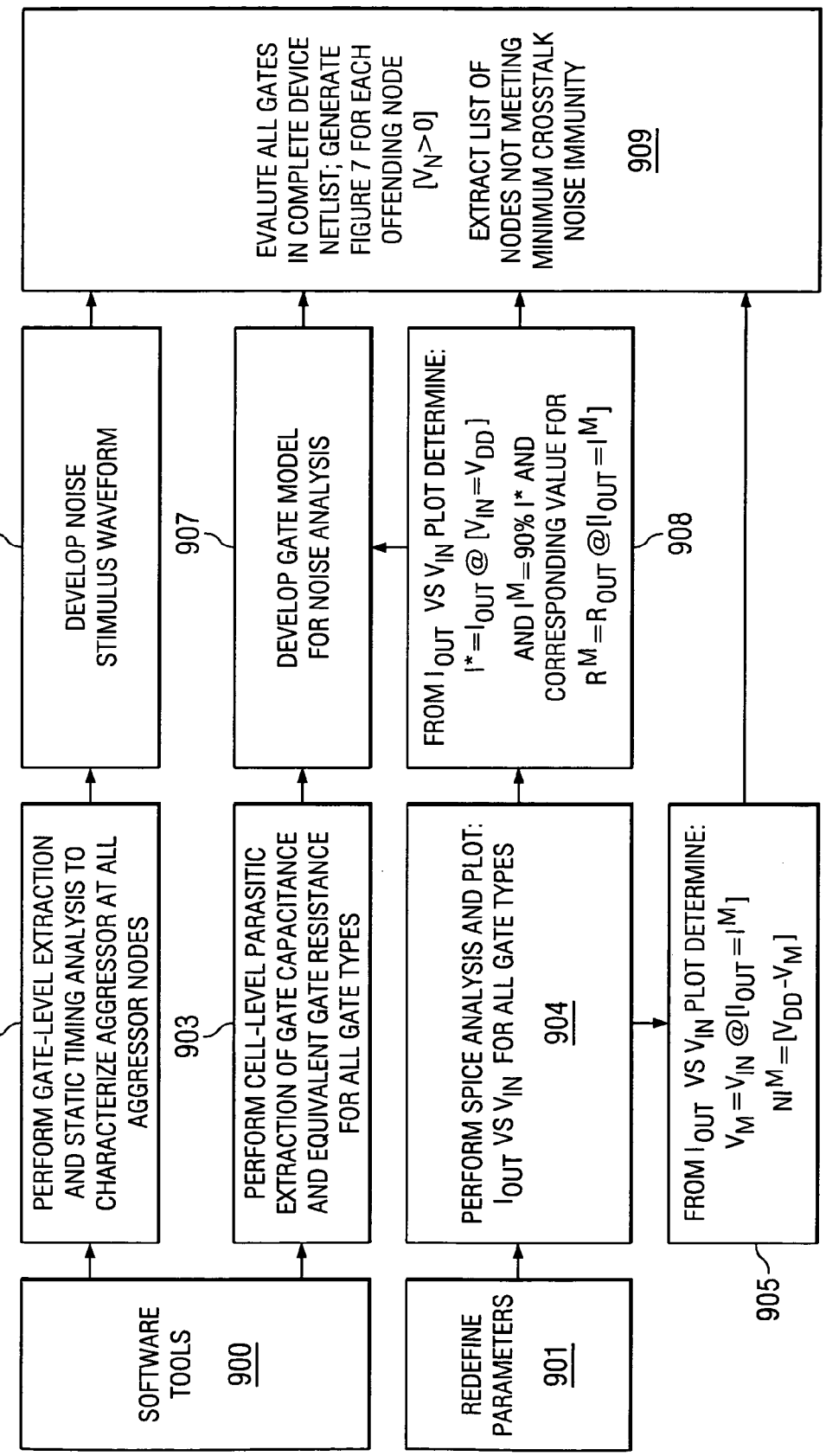
FIG. 9 illustrates a flow chart for the accurate noise modeling method of this invention.

FIG. 9 illustrates the flow chart for the accurate noise modeling methods of this invention. The methodology consists of two major departures from current noise modeling technology. Software tools 900 are used extensively, and a crucial redefinition 901 of noise modeling parameters is employed. Gate-Level Extraction and Static Timing Analysis 902 is performed to glean information as to the aggressor characteristics and to provide a means for selecting a realistic noise simulation waveform 906. Cell-Level Parasitic Extraction is performed 903 to obtain gate capacitance and resistance for all gate types used in the design. This is a primary input in developing the gate model 907 of FIG. 6 used in the cross-talk noise analysis.

The redefinition of parameters 901 for cross-talk noise analysis begins with an exhaustive analysis of all gate types using spice 904 to obtain an $I_{OUT}$ vs $V_{IN}$ plot. This $I_{OUT}$ vs $V_{IN}$ plot allows for definition of $NI^M$ 905 and $R_M$ 908 These parameters allow for the full evaluation of the complete device netlist, by effectively generating the result illustrated in FIG. 7 for all possible offending aggressors. By establishing the criteria that each gate for which $V_N>0$ must be extracted and included in a list of nodes not meeting minimum cross-talk noise immunity.

What is claimed is:

1. An integrated circuit noise analysis method comprising the steps of:
   for each gate type in the integrated circuit
      calculating an equivalent output resistance,
      calculating an equivalent output capacitance,
      calculating a noise immunity, and
      identifying aggressor nodes for each gate including aggressor coupling capacitance and aggressor series resistance; and
   for all gates in the integrated circuit
      applying a preselected aggressor noise pulse to a gate output,
      comparing the gate output noise response to corresponding noise immunity,
      identifying gates where output noise response exceeds corresponding noise immunity; and
      calculating an equivalent of output resistance from the ratio of a required slew rate to the calculated equivalent output capacitance, wherein said step of calculating the equivalent output resistance further includes
         comparing the calculated equivalent output resistance to an ideal DC static output resistance realized from the specific transistor size for each gate, and
         validating the calculated equivalent output resistance if it exceeds the corresponding ideal DC static output resistance by a prescribed margin.

2. The method of noise analysis of claim 1 further comprising the steps of:
   calculating an equivalent output capacitance for each gate type from the sum of the output transistor drain-source capacitance and estimated parasitic capacitance.

3. The method of noise analysis of claim 1 wherein:
   said step of applying a preselected aggressor noise pulse to a gate output employs a preselected aggressor noise pulse formed by a triangular wave having leading edge and trailing edge slope equal to skew rate of corresponding gate and a voltage peak equal to one half the voltage threshold of the corresponding gate.

4. The method of noise analysis of claim 1 wherein:
   said step of applying a preselected aggressor noise pulse to a gate output includes determining an aggressor coupling capacitance and an aggressor series resistance using static timing analysis software tools.

5. An integrated circuit noise analysis method comprising the steps of:
   for each gate type in the integrated circuit
      calculating an equivalent output resistance,
      calculating an equivalent output capacitance,
      calculating a noise immunity, and identifying aggressor nodes for each gate including aggressor coupling capacitance and aggressor series resistance; and for all gates in the integrated circuit applying a preselected aggressor noise pulse to a gate output, wherein said step of applying a preselected aggressor noise pulse to a gate output employs a preselected aggressor noise pulse formed by a triangular wave having leading edge and trailing edge slope equal to skew rate of corresponding gate and a voltage peak equal to one half the voltage threshold of the corresponding gate, comparing the gate output noise response to corresponding noise immunity, and identifying gates where output noise response exceeds corresponding noise immunity.

6. The method of noise analysis of claim 5 further comprising the steps of:

calculating an equivalent output capacitance for each gate type from the sum of the output transistor drain-source capacitance and estimated parasitic capacitance.

7. The method of noise analysis of claim 5 further comprising the steps of:

calculating an equivalent of output resistance from the ratio of a required slew rate to the calculated equivalent output capacitance.

8. The method of noise analysis of claim 7 wherein:

said step of calculating the equivalent output resistance further includes comparing the calculated equivalent output resistance to an ideal DC static output resistance realized from the specific transistor size for each gate, and validating the calculated equivalent output resistance if it exceeds the corresponding ideal DC static output resistance by a prescribed margin.

9. The method of noise analysis of claim 5 wherein:

said step of applying a preselected aggressor noise pulse to a gate output includes determining an aggressor coupling capacitance and an aggressor series resistance using static timing analysis software tools.

* * * * *